(12) United States Patent  
Quinn

(10) Patent No.: US 7,956,438 B2
(45) Date of Patent: Jun. 7, 2011

(54) INTEGRATED CAPACITOR WITH INTERLINKED LATERAL FINS

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 252 days.

(21) Appl. No.: 12/276,292

(22) Filed: Nov. 21, 2008

(65) Prior Publication Data

US 2010/0127351 A1    May 27, 2010

(51) Int. Cl.
*H01L 29/00* (2006.01)
(52) U.S. Cl. ............... 257/516; 257/532; 257/E29.343; 257/E21.008
(58) Field of Classification Search .................. None
See application file for complete search history.

(56) References Cited

U.S. PATENT DOCUMENTS

| | | |
|---|---|---|
| 1,899,176 A | 2/1933 | Bailey |
| 3,593,319 A | 7/1971 | Barber |
| 4,156,249 A | 5/1979 | Koo |
| 4,249,196 A | 2/1981 | Durney et al. |
| 4,409,608 A | 10/1983 | Yoder |
| 4,427,457 A | 1/1984 | Carlson et al. |
| 4,470,096 A | 9/1984 | Guertin |
| 4,470,099 A | 9/1984 | Sawairi |
| 4,571,543 A | 2/1986 | Raymond et al. |
| 4,639,686 A | 1/1987 | Beckenbach et al. |
| 4,700,457 A | 10/1987 | Matsukawa |
| 4,731,696 A | 3/1988 | Himes et al. |
| 4,827,323 A | 5/1989 | Tigelaar et al. |
| 4,831,431 A | 5/1989 | Hanlon |
| 4,878,151 A | 10/1989 | Gallichio |
| 4,914,546 A | 4/1990 | Alter |
| 4,937,649 A | 6/1990 | Shiba et al. |
| 4,994,688 A | 2/1991 | Horiguchi et al. |
| 5,005,103 A | 4/1991 | Kwon et al. |
| 5,021,920 A | 6/1991 | Smith |
| 5,077,225 A | 12/1991 | Lee |
| 5,083,184 A | 1/1992 | Eguchi |
| 5,089,878 A | 2/1992 | Lee |

(Continued)

FOREIGN PATENT DOCUMENTS

DE        25 48 563 A1     5/1977

(Continued)

OTHER PUBLICATIONS

Fukuda, H. et al., "Enumeration of Polyominoes, Polyiamonds and Polyhexes for Isohedral Tilings with Rotational Symmetry", Jun. 11, 2007, Computational Geometry and Graph Theory, Springer Berlin Heidelberg, Berlin Heidelberg, pp. 68-78.

(Continued)

*Primary Examiner* — Alonzo Chambliss
(74) *Attorney, Agent, or Firm* — Scott Hewett

(57) ABSTRACT

A capacitor in an integrated circuit ("IC") has a first node conductor formed in a first metal layer of the IC with a first spine extending along a first direction, a first vertical element extending from the first spine along a second direction perpendicular to the first direction. A first capital element extends along the first direction, and a first serif element extends from the capital element. The capacitor also has a second node conductor having a second spine, a second vertical element extending from the second spine toward the first spine, a second capital element, and a second serif element extending from the second capital between the first vertical element and the first serif element.

19 Claims, 4 Drawing Sheets

U.S. PATENT DOCUMENTS

| | | | |
|---|---|---|---|
| 5,117,114 A | 5/1992 | Street et al. | |
| 5,119,169 A | 6/1992 | Kozono et al. | |
| 5,142,639 A | 8/1992 | Kohyama et al. | |
| 5,155,658 A | 10/1992 | Inam et al. | |
| 5,166,858 A | 11/1992 | Frake et al. | |
| 5,172,299 A | 12/1992 | Yamada et al. | |
| 5,177,410 A | 1/1993 | Hashiguchi et al. | |
| 5,189,594 A | 2/1993 | Hoshiba | |
| 5,208,725 A | 5/1993 | Akcasu | |
| 5,275,974 A | 1/1994 | Ellul et al. | |
| 5,583,359 A * | 12/1996 | Ng et al. | 257/306 |
| 5,712,813 A | 1/1998 | Zhang | |
| 5,868,388 A | 2/1999 | Wood et al. | |
| 5,939,766 A | 8/1999 | Stolmeijer et al. | |
| 6,037,621 A | 3/2000 | Wilson | |
| 6,064,108 A | 5/2000 | Martinez | |
| 6,066,537 A | 5/2000 | Poh | |
| 6,297,524 B1 | 10/2001 | Vathulya et al. | |
| 6,303,456 B1 | 10/2001 | Pricer et al. | |
| 6,303,457 B1 | 10/2001 | Christensen et al. | |
| 6,383,858 B1 | 5/2002 | Gupta et al. | |
| 6,385,033 B1 | 5/2002 | Javanifard et al. | |
| 6,410,954 B1 | 6/2002 | Sowlati et al. | |
| 6,417,556 B1 | 7/2002 | Long et al. | |
| 6,542,351 B1 | 4/2003 | Kwang | |
| 6,570,210 B1 | 5/2003 | Sowlati et al. | |
| 6,597,562 B1 | 7/2003 | Hu et al. | |
| 6,625,006 B1 | 9/2003 | Aram et al. | |
| 6,653,681 B2 | 11/2003 | Appel | |
| 6,661,079 B1 | 12/2003 | Bikulcius | |
| 6,690,570 B2 | 2/2004 | Hajimiri et al. | |
| 6,737,698 B1 | 5/2004 | Paul et al. | |
| 6,747,307 B1 | 6/2004 | Vathulya et al. | |
| 6,765,778 B1 | 7/2004 | Du et al. | |
| 6,819,542 B2 | 11/2004 | Tsai et al. | |
| 6,822,312 B2 | 11/2004 | Sowlati et al. | |
| 6,880,134 B2 | 4/2005 | Drennan | |
| 6,882,015 B2 | 4/2005 | Bernstein et al. | |
| 6,897,505 B2 | 5/2005 | Aton | |
| 6,903,918 B1 | 6/2005 | Brennan | |
| 6,927,125 B2 | 8/2005 | Jones et al. | |
| 6,933,551 B1 | 8/2005 | Stribley et al. | |
| 6,949,781 B2 | 9/2005 | Chang et al. | |
| 6,963,122 B1 | 11/2005 | Soenen et al. | |
| 6,974,744 B1 | 12/2005 | Aram et al. | |
| 7,009,832 B1 | 3/2006 | Chen et al. | |
| 7,013,436 B1 | 3/2006 | Morton et al. | |
| 7,027,287 B2 | 4/2006 | Georgakos | |
| 7,038,296 B2 | 5/2006 | Laws | |
| 7,050,290 B2 | 5/2006 | Tang et al. | |
| 7,116,544 B1 | 10/2006 | Sutardja | |
| 7,154,734 B2 | 12/2006 | Schultz et al. | |
| 7,161,228 B1 | 1/2007 | Pettit | |
| 7,170,178 B2 | 1/2007 | Bely et al. | |
| 7,193,263 B2 | 3/2007 | Barth | |
| 7,195,971 B2 | 3/2007 | Bernstein et al. | |
| 7,202,548 B2 | 4/2007 | Lee | |
| 7,259,956 B2 | 8/2007 | Fong et al. | |
| 7,271,465 B2 | 9/2007 | Jessie et al. | |
| 7,274,085 B1 | 9/2007 | Hsu et al. | |
| 7,298,001 B1 | 11/2007 | Liu | |
| 7,348,624 B2 | 3/2008 | Sakaguchi et al. | |
| 7,485,914 B2 | 2/2009 | Huang et al. | |
| 7,663,233 B2 | 2/2010 | Lim | |
| 7,768,054 B2 | 8/2010 | Benetik | |
| 2005/0077581 A1 | 4/2005 | Chang et al. | |
| 2005/0135042 A1 | 6/2005 | Chiu-Kit Fong et al. | |
| 2005/0161725 A1 | 7/2005 | Da Dalt | |
| 2006/0203424 A1 | 9/2006 | Chen et al. | |
| 2007/0181973 A1 | 8/2007 | Hung et al. | |
| 2007/0187739 A1 * | 8/2007 | Liu et al. | 257/306 |
| 2007/0190760 A1 | 8/2007 | Coolbaugh et al. | |
| 2007/0278551 A1 | 12/2007 | Anthony | |
| 2007/0296013 A1 | 12/2007 | Chang et al. | |
| 2009/0057826 A1 | 3/2009 | Kim et al. | |

FOREIGN PATENT DOCUMENTS

| | | |
|---|---|---|
| DE | 100 46 910 A1 | 10/2001 |
| GB | 1 149 569 | 4/1969 |
| GB | 1 469 944 A | 4/1977 |
| JP | 57-106804 | 7/1982 |
| JP | 58-051552 | 3/1983 |
| JP | 59-91718 | 6/1984 |
| JP | 61-259560 A | 11/1986 |
| JP | 61-263251 A | 11/1986 |
| JP | 63-070550 | 3/1988 |
| JP | 01084616 A | 3/1989 |
| JP | 01096943 A | 4/1989 |
| JP | 01-313917 | 12/1989 |
| JP | 02231755 A | 9/1990 |
| JP | 02-268439 | 11/1990 |
| JP | 02-307275 | 12/1990 |
| JP | 03-008360 | 1/1991 |
| JP | 03-071612 | 3/1991 |
| JP | 04-268756 | 9/1992 |
| JP | 07-283076 | 10/1995 |
| WO | WO 03/090280 | 10/2003 |

OTHER PUBLICATIONS

Rhoads et al., "Planar tilings by polyominoes, polyhexes and polyiamonds", Journal of Computational and Applied Mathematics, Amsterdam, NL, vol. 174, No. 2, Feb. 15, 2005, pp. 329-353.

Amintoosi et al., "Using pattern matching for tiling and packing problems" European Journal of Operational Research, Amsterdam, NL, vol. 83, No. 3, Jul. 10, 2007, pp. 950-960.

Jacobsen, Jesper, Lykke "Tetromino tilings and the Tutte polynomial", Journal of Physics A: Mathematical and Theoretical, vol. 40, No. 7, Feb. 16, 2007. pp. 1439-1446.

U.S. Appl. No. 12/276,289, filed Nov. 21, 2008, Quinn, Patrick J., Xilinx, Inc. 2100 Logic Drive, San Jose, California.

U.S. Appl. No. 12/276,291, filed Nov. 21, 2008, Quinn, Patrick J., Xilinx, Inc. 2100 Logic Drive, San Jose, California.

U.S. Appl. No. 12/276,293, filed Nov. 21, 2008, Quinn, Patrick J., Xilinx, Inc. 2100 Logic Drive, San Jose, California.

U.S. Appl. No. 12/276,296, filed Nov. 21, 2008, Quinn, Patrick J., Xilinx, Inc. 2100 Logic Drive, San Jose, California.

U.S. Appl. No. 12/276,280, filed Nov. 21, 2008, Quinn, Patrick J., Xilinx, Inc. 2100 Logic Drive, San Jose, California.

Aparicio and Hajimiri, "Capacity Limits and Matching Properties of Integrated Capacitors", IEEE J. Solid-State circuits, vol. 37, No. 3, pp. 384-393, Mar. 2002.

Samavati, H. et al., "Fractal Capacitor", IEEE Journal of Solid-State Circuit, vol. 33, No. 12 pp. 2035-2041, Dec. 1998.

Sowlati et al., "High Density Capacitance Structures in Submicron CMOS for Low Power RF Applications", International Symposium on Low Power Electronics and Design, 2001, Aug. 6-7, 2001, pp. 243-246.

Wakayama et al., "A 30-MHz Low-Jitter High-Linearity CMOS Voltage-Controlled Oscillator", IEEE Journal of Solid-State Circuits, vol. sc-22, No. 6, Dec. 1987, pp. 1074-1081.

Chan et al., "Analysis of MMIC Structures Using an Efficient Iterative Approach", IEEE Transactions on Microwave Theory and Techniques, vol. 36, No. 1, Jan. 1988, pp. 96-105.

Imamura et al., "Bending-Comb capacitor with a Small Parasitic Inductance", 2002 Symposium on VLSI Circuits Digest of Technical Papers, IEEE 2002, Jun. 13-15, 2002, pp. 22-25.

Rajagopalan et al., "Optimization of Metal-Metal Comb-Capacitors for RF Applications", Wireless Design & Development, Mar. 4, 2001, pp. 1-4.

* cited by examiner

INTEGRATED CAPACITOR WITH INTERLINKED LATERAL FINS

RELATED APPLICATIONS

This patent application is being concurrently filed with commonly owned U.S. patent application entitled SHIELDING FOR INTEGRATED CAPACITORS by Patrick J. Quinn; and with commonly owned U.S. patent application entitled INTEGRATED CAPACITOR WITH TARTAN CROSS SECTION by Patrick J. Quinn; and with commonly owned U.S. patent application entitled INTEGRATED CAPACITOR WITH CABLED PLATES by Patrick J. Quinn; and with commonly owned U.S. patent application entitled INTEGRATED CAPACITOR WITH ARRAY OF CROSSES by Patrick J. Quinn; and with commonly owned U.S. patent application entitled INTEGRATED CAPACITOR WITH ALTERNATING LAYERED SEGMENTS by Jan L. de Jong et al., the disclosures of which are each hereby incorporated by reference in their entireties for all purposes.

FIELD OF THE INVENTION

The present invention relates to capacitors formed in integrated circuits ("ICs") commonly referred to as "integrated capacitors".

BACKGROUND

Methods of fabricating ICs typically include a front-end sequence of processing, in which various electrical devices such as transistors are formed in a semiconductor substrate, and a back-end sequence of processing, generally including forming alternating layers of dielectric material and patterned conductive material (typically metal) with conductive vias or other techniques being used to interconnect the metal layers to form a three-dimensional wiring structure that connects electrical devices to other electrical devices and to terminals of the IC.

Capacitors are used in IC systems for a variety of purposes. In many instances, it is desirable to incorporate (integrate) a capacitor in the IC chip. A simple approach is to form two conductive plates with an intervening dielectric; however, this consumes a relatively large area for the capacitance obtained. One technique for increasing the capacitance of a given area is to use multiple conductive plates, each conductive plate separated from the proximate plate(s) by dielectric. Further techniques use conducting strips, also called conductive lines, conductive fingers, or conductive traces that are alternately connected to the first and second capacitor terminals (nodes). Sidewall coupling between the conductive strips provides capacitance. Layers of conducting strips, either offset or arranged in vertical congruency, can be added to further increase the capacitance of an integrated capacitor structure.

One capacitor has a number of conductive strips in successive layers connected to the first node alternating with an equal number of conductive strips connected to the second node of the integrated capacitor. The conductive strips are offset a half cell on successive layers, so that a conductive strip connected to the first node has conductive strips connected to the second node above and on both sides of it. Providing an equal number of conductive strips in a layer for each node balances the coupling of each node to the substrate, which is desirable in some applications, but undesirable in others, such as switching applications where it is desirable to have less coupling at one node. In order to reduce coupling to the substrate, a thick layer of silicon dioxide is used between the substrate and the first layer of conductive strips. This may be difficult to integrate in a standard CMOS fabrication sequence, and might require additional steps to be added to the standard process flow. The overlapping parallel conductive strips are connected at their ends using buss strips that consume additional surface area.

Another approach to providing an integrated capacitor is to have conductive strips in a layer connected to alternate nodes of the capacitor with overlapping conductive strips connected to the same node. This forms essentially a curtain of conductive strips and interconnecting vias connected to the first node of the capacitor with adjacent curtains of conductive strips and interconnecting vias connected to the second node. Overlapping conductive strips connected to the same node avoids the lost surface area associated with buss strips; however, inter-layer capacitance is reduced because the upper strip is connected to the same node as the lower strip. This effect is somewhat obviated because, as critical dimensions shrink, inter-strip capacitance becomes more dominant than inter-layer capacitance. In other words, the dielectric layer separation between successive metal layers becomes increasingly greater than the dielectric separation between conductive strips with decreasing critical dimension.

It is generally desirable that integrated capacitors have high specific capacitance; however, manufacturability and quality factor ("Q factor") is also a concern in many instances. One manufacturability concern is controlling the final capacitance value of an integrated capacitor, both within a large IC, across a wafer, and lot-to-lot.

Thus, integrated capacitors manufacturable to provide a consistent capacitance value are desired. It is further generally desired that integrated capacitors have high capacitance per unit area, low loss (resistance), and low self-inductance, which improves high-frequency applications by increasing self-resonant frequency and the quality of capacitor circuits. In some applications, it is further desirable to shield integrated capacitors from electrical noise.

SUMMARY

A capacitor in an integrated circuit ("IC") has a first node conductor formed in a first metal layer of the IC with a first spine extending along a first direction, a first vertical element extending from the first spine along a second direction perpendicular to the first direction, a first capital element extending along the first direction, and a first serif element extending from the capital element toward the first spine. The capacitor also has a second node conductor formed in the first metal layer of the IC having a second spine extending along the first direction, a second vertical element extending from the second spine along the second direction toward the first spine, a second capital element extending along the first direction between the first spine and the second spine, and a second serif element extending from the second capital element toward the second spine, the second serif element being disposed between the first vertical element and the first serif element.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

Figure 1A:
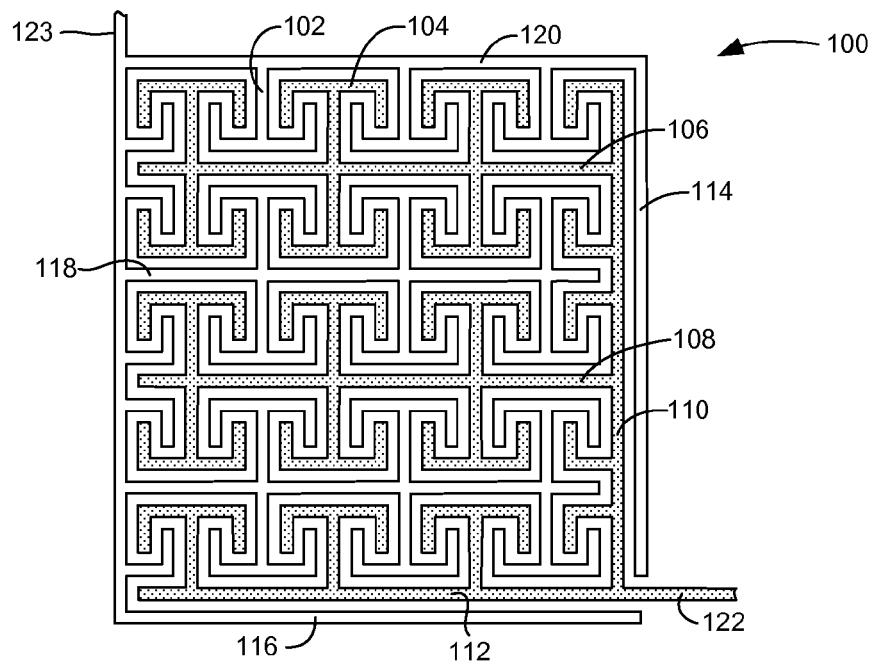
FIG. 1A is plan view of a layer of an integrated capacitor with a quasi-fractal pattern of interlinked lateral fins according to an embodiment.

Complex ICs, such as programmable logic devices, often have several patterned metal layers separated by layers of dielectric material formed over a semiconductor substrate that are used for wiring connections and other functions. Some embodiments of the invention are adaptable to existing CMOS process sequences by using masks that form the desired patterns in the appropriate metal layers and vias through the inter-metal dielectric ("IMD") layers or interlayer dielectric ("ILD"). The vias are formed using any of several known techniques, such as contact plug, damascene, or dual damascene techniques. Similarly, the conductive strips are formed using any of several known techniques, such as thin-film metal etch, thin-film metal lift-off, damascene, and dual damascene techniques. In some embodiments, one of the conductive layers is a polysilicon or silicide layer. In a further embodiment, a conductive well in the semiconductor substrate forms a portion of a capacitor plate or a shield.

Integrated capacitors are used in a variety of applications. While high specific capacitance is generally desirable to reduce the surface area of the IC devoted to the integrated capacitor, the resultant capacitance value is also very important in many applications, such as tuning applications. In other words, the capacitance value across an IC chip, across a wafer, and lot-to-lot is important enough to sacrifice specific capacitance in some applications. Integrated capacitors that rely primarily on intra-layer (lateral) capacitance show relatively low variance compared to integrated capacitors that rely heavily on inter-layer (vertical) capacitance because the dimensional accuracy is more controllable. Note that a capacitor is generally thought of as a two terminal device, and the "top" and "bottom" nodes as described herein generally correspond to these two terminals of the capacitor. Thus, the structures described below may be thought of as connecting (e.g., electrically) to one or the other node, or forming portions of a node. A node is not separate from the capacitive structures connected to it, but those structures may form portions of a node.

The terms "top" node and "bottom" node do not necessarily relate to the physical orientation of the nodes relative to the IC or other structure, but are used as terms of convenience. In some circuit applications, the top node of a capacitor indicates the node that is connected to a high-impedance or high-gain port of an amplifier or other device. In a system-on-chip ("SoC"), the accuracy on an analog-to-digital converter ("ADC") is dependent on the ratio of the parasitic capacitance at the top node ($C_{top}$) to all other nodes except the bottom node and the capacitance ($C_{sig}$) that is the useful floating signal capacitance between both nodes. It is desirable to shield the top plate from ground currents or voltage supply fluctuations so that $C_{top}$ remains low. Using the bottom node to essentially surround the top node isolates the top node from coupling with other nodes in the circuit by essentially forming a portion of Faraday shell around the top node, and in some embodiments, distancing the top node from other conductive elements in the IC. It is understood by those of skill in the art that electrical connection to the top node is made through the bottom node shield, and therefore the bottom node shield does not completely surround the top node.

In some embodiments, some sides of the top node are left unshielded. For example, an end of the top node that is physically distant from other nodes might be left unshielded. In other embodiments, integrated capacitors are used as design cells, and adjacent integrated capacitors are connected in parallel to obtain a higher total capacitance. In some embodiments, the portions of the bottom node shield of adjacent commonly-connected integrated capacitors are omitted, allowing higher packing density. In yet other applications, such as high-frequency analog circuits in MGTs (multi-gigabit transceivers) of an FPGA (field programmable gate array), a node shield is omitted to maintain balance between the plates of the capacitor. Capacitors are generally useful in a wide variety of integrated circuits and in a wide variety of applications. For instance, one or more capacitors may be useful for a switched capacitor network, such as in an analog-to-digital converter, or as a decoupling or filtering capacitor for AC signaling (e.g., in an MGT). In general, the capacitor structure described herein may be useful in any application requiring capacitance.

FIG. 1A is a plan view of a layer of an integrated capacitor 100 with a pattern of interlinked lateral fins according to an embodiment. The interlinking pattern is a repeating pattern of T-shaped fins of a bottom node conductor 102 interlinked with a corresponding pattern of T-shaped fins of a top node conductor 104. The serif (see FIG. 1B, ref. num. 150) of one fin is between the vertical (see FIG. 1B, ref. num. 142) and serif of an adjacent fin (see FIG. 1B, ref. num. 148). The term "vertical" is used to describe the conductive element of the fin according to terminology associated with lettering, and does not necessarily refer to any particular orientation of this conductive element.

Tiers of fins of the top node conductor 104 are electrically connected together with a buss bar 110. T-shaped fins extend orthogonally from spines 106, 108 of a tier in both directions. The fins are opposite each other (i.e., are mirror imaged along the axis of the spine 106), but are not opposite each other in alternative embodiments (i.e., a fin extending from the spine in one direction is not directly opposite a fin extending from the spine in the other direction).

The outermost spine 112 and buss bar 110 of the top node conductor 104 are enclosed with bottom node shield bars 114, 116. Fins extend from the outermost spine 112 inward to interlink with corresponding fins having the opposite node polarity. The bottom node shield bars 114, 116 shield the outermost spine 112 and buss bar 110 of the top node conductor from laterally coupling to other nodes of the IC while laterally coupling to the buss bar 110 and outermost spine 112 of the top node conductor. The buss bar 118 and outermost spine 120 of the bottom node conductor similarly shield T-shaped fins and other conductive features of the top node conductor 104. Thus, the top node conductor 104 is essentially completely encased in the bottom node conductor 102, except for a small gap that is provided for a top node contact trace 122. In an alternative embodiment, the bottom node conductor completely encases the top node conductor and electrical connection to the top node conductor is made through one or more vias from a metal layer in the backend stack of the IC that is above or below the metal layer the top node conductor is formed in.

The top and bottom node conductors are formed in dielectric material, such as deposited silicon dioxide, or other dielectric. In a particular embodiment, trenches are formed in the dielectric material and then the trenches are filled with metal to form metal traces. In a particular embodiment, the metal traces are deeper than they are wide, which promotes lateral capacitance and close-packing for high specific capacitance. In an exemplary embodiment, the metal traces are manufactured to have a minimum metal line width allowed in the manufacturing technology node process for the metal layer in which the traces are formed, and have the minimum metal trace spacing (i.e., dielectric sidewall thickness) allowed. In another embodiment, both the metal trace width and the metal trace spacing are 10% over the minimum allowable values for the metal layer, which may provide improved reliability and yield. In other embodiments the metal trace width and spacing are chosen to balance the need for a high specific capacitance and the need for good manufacturability and reliability. In yet another embodiment, a first metal layer has a first minimum linewidth and a first minimum spacing and a second metal layer has a second minimum linewidth greater than the first minimum linewidth and a second minimum spacing greater than the first minimum spacing, as is often the case in backend stack metal layers. For example, the $M^{th}$ metal layer may require wider traces and spacing than the $M^{th}$-1 metal layer. In an embodiment where the polarity (i.e., node connections) alternates in successive metal layers (see, e.g., FIG. 2B), the feature size in the $M^{th}$-1 layer is chosen to underlie the features in the $M^{th}$ layer to obtain good vertical capacitive coupling. In other words, the features in the $M^{th}$-1 layer are larger than could be obtained according to the minimum design rules in order to match the features in the upper adjacent $M^{th}$ layer. In an alternative embodiment, successive layers have similar T-shaped fin arrays of different size (linewidths and spacings), some of which overlap or partially overlap conductive elements connected to the opposite node in the lower metal layer. The fin arrays are electrically connected to the capacitor nodes through traces 122, 123 in the metal layer the fins are defined in, or to through vias (see, e.g., FIG. 2A, ref. num. 210) to a node element in a superior or inferior (i.e., above or below) conductive layer. In a particular embodiment, electrical connection to the top node conductor 104 is made through trace 122, and trace 123 is omitted, the electrical connection to the bottom node conductor being made through vias to another layer, such as bottom node shield plate (see, FIG. 2B, ref. num 214).

In a further embodiment, the top and bottom node connectors include conducting vias, such as vias formed using a dual damascene process, extending from the metal traces in the metal layer illustrated in FIG. 1A toward the next lower metal or poly layer or substrate. In one embodiment, the vias are connected to top and bottom node conductors in the lower metal layer. In a particular embodiment, the top and bottom node conductors in the lower metal layer are essentially identical to and have the same polarity as the metal pattern in the layer illustrated in FIG. 1A and the conductive vias connect node conductors in successive metal layers. In an alternative embodiment, the vias are single ended and are not electrically connected to an underlying metal layer, but increase the lateral capacitance of the top and bottom node conductors. In a 40 nm node technology, adding conductive vias to top and bottom node conductors is expected to increase specific capacitance of an integrated capacitor according to FIG. 1A by about 15% when the maximum allowable number of conductive vias are added on the minimum via spacing or near minimum via spacing.

Figure 1B:
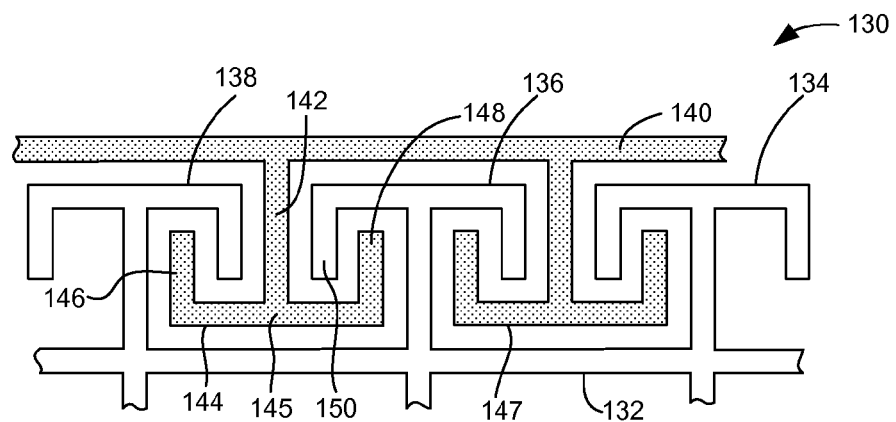
FIG. 1B is a plan view of a portion of the integrated capacitor of FIG. 1A.

FIG. 1B is a plan view of a portion 130 of the integrated capacitor of FIG. 1A. A tier of the top node conductor includes a spine 132 and fins 134, 136, 138. Several types of fins are alternative used in embodiments. The integrated capacitor has a bottom node tier with bottom node fins 144, 147 extending from the bottom node spine 140 and alternating with the top node fins 134, 136, 138. The top node fin 144 has a first vertical conductive element 142 extending from the bottom node spine 140 to a capital 145 of the bottom node fin. The spine 140 extends along a first direction and the vertical element 142 extends from the spine 140 is along a second direction essentially perpendicular to the first direction. A capital element 145 extend along the first direction between a first serif element 146 and a second serif element 148, both of which extend from the capital element 145 back toward the spine 140 of the tier along the second direction, essentially parallel to the first vertical element 142. A third serif element 150 of the top node fin 136 is disposed between the first vertical element 142 and the second serif element 148. The top node fins are similar to the bottom node fins and a detailed description of the top node fins is therefore omitted. In an further embodiment, a fin includes ledges extending from the distal ends of the serifs back along the first direction back toward the vertical element and interlocking with corresponding ledges on opposing fins of the opposite polarity.

Figure 1C:
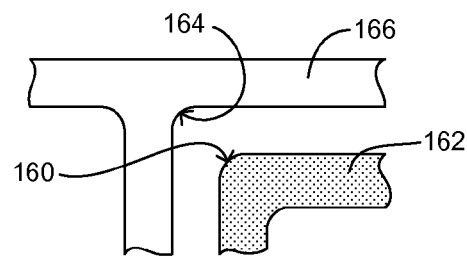
FIG. 1C is a plan view illustrating corner rounding in an embodiment of an integrated capacitor in accordance with FIG. 1A.

FIG. 1C is a plan view illustrating corner rounding in an embodiment of an integrated capacitor in accordance with FIG. 1A. An exterior corner 160 of a first node conductor 162 is opposite an interior corner 164 of a second node conductor 166. Corner rounding due to light scattering in the lithographic process is a common problem when defining fine metal features in small node technology (generally less than 90 nm and more particularly in a 65 nm or less CMOS processes); however, corner rounding does not degrade the specific capacitance of this integrated capacitor because the rounding of one corner is matched by rounding in the opposite corner. The quasi-fractal pattern of FIG. 1A is largely unaffected by corner rounding, and thus is less susceptible to process spreads, providing improved matching between integrated capacitors on an IC or between ICs across a wafer.

Figure 2A:
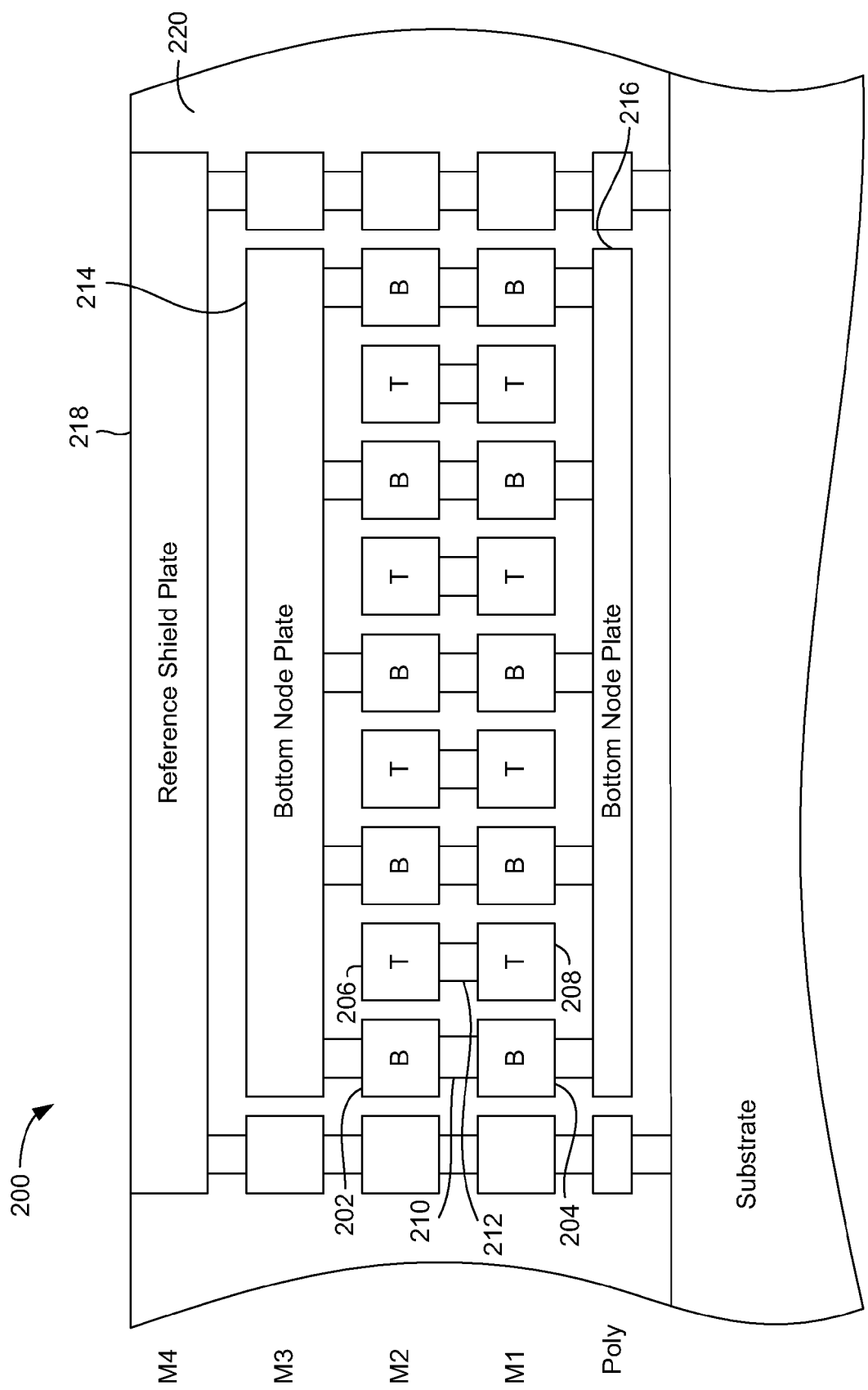
FIG. 2A is a side view of an integrated capacitor incorporated in the backend layers of an integrated circuit.

FIG. 2A is a side view of an integrated capacitor 200 incorporated in the backend layers of an integrated circuit. The integrated capacitor 200 shows a cross section of only a few fins and partial fins for simplicity and clarity of illustration. A typical integrated capacitor according to an embodiment has hundreds of fins in a tier. A first metal layer M1 and a second metal layer M2 both have a quasi-fractal pattern of interlinked fins in accordance with FIG. 1A. The second metal layer M2 has the same polarity as the first metal layer M1, that is, a top node conductor 202 of the second metal layer overlies a top node conductor 204 of the first metal layer, and a bottom node conductor 206 of the second metal layer overlies a bottom node conductor 208 of the first metal layer. Conductive vias 210, 212 between the top node conductors and between the bottom node conductors increase the lateral capacitance between the top and bottom nodes by providing inter-via capacitive coupling, which offsets the loss in vertical capacitive coupling compared to embodiments wherein the polarity of overlying conductive elements alternates (see, e.g., FIG. 2B).

The integrated capacitor 200 includes an optional upper bottom node shield plate 214 and an optional lower bottom node shield plate 216, which in a particular embodiment is formed in the polysilicon ("poly") layer of the IC, but in general may be formed in any suitable layer. The upper bottom node shield plate is typically formed of wide strips of patterned metal, rather than a contiguous sheet of metal, because most IC fabrication processes have maximum line width specifications for features formed in a metal layer. The lower bottom node shield plate formed in a poly layer can be a contiguous sheet if design rules allow such a structure. A lower bottom node shield plate formed in a metal layer would likely also be formed of wide strips of patterned metal. The upper and lower bottom shield plates shield the top node from unwanted coupling to other nodes in the IC, and provide additional vertical coupling to top node conductors in the intermediate metal layers, thus increasing specific capacitance of the integrated capacitor.

Shielding of the top node conductive elements by the bottom node conductive elements is desirable for insuring low-distortion sampled data transfers in an IC, for example. In a further embodiment, an optional reference shield plate 218 connected to analog ground, digital ground, or Vdd, for example, can be provided to shield the bottom node from unwanted coupling to other nodes in the IC. Dielectric material 220, such as silicon-oxide(s) formed from thermal and deposition processes, electrically isolates nodes in the IC. In some embodiments, part or all of the shielding may be omitted depending on the requirements of the particular application.

In a further embodiment, a third metal layer has the quasi-fractal pattern, and the optional shield plate is formed in a fifth metal layer, which in a particular embodiment is a ground plane layer of the IC. In another embodiment, an additional layer of interlinked fins is included (e.g., the bottom node shield plate 214 is formed in the M4 layer and the reference shield plate 218 is formed in the M5 layer). Forming a ground shield plate in the M5 layer is particularly desirable in ICs where the M5 layer is used to provide a ground plane layer, and more particularly where the portion of the M5 layer overlying the integrated capacitor provides an analog ground plane, which often has less electrical noise than a digital ground node in the IC. In another embodiment additional layers of interlinked fins are formed in the M3 and M4 layers, and the bottom node plate is formed in the M5 layer. In yet another embodiment, shield plates are omitted, or only one shield plate (e.g., poly plate 216) is provided.

Figure 2B:
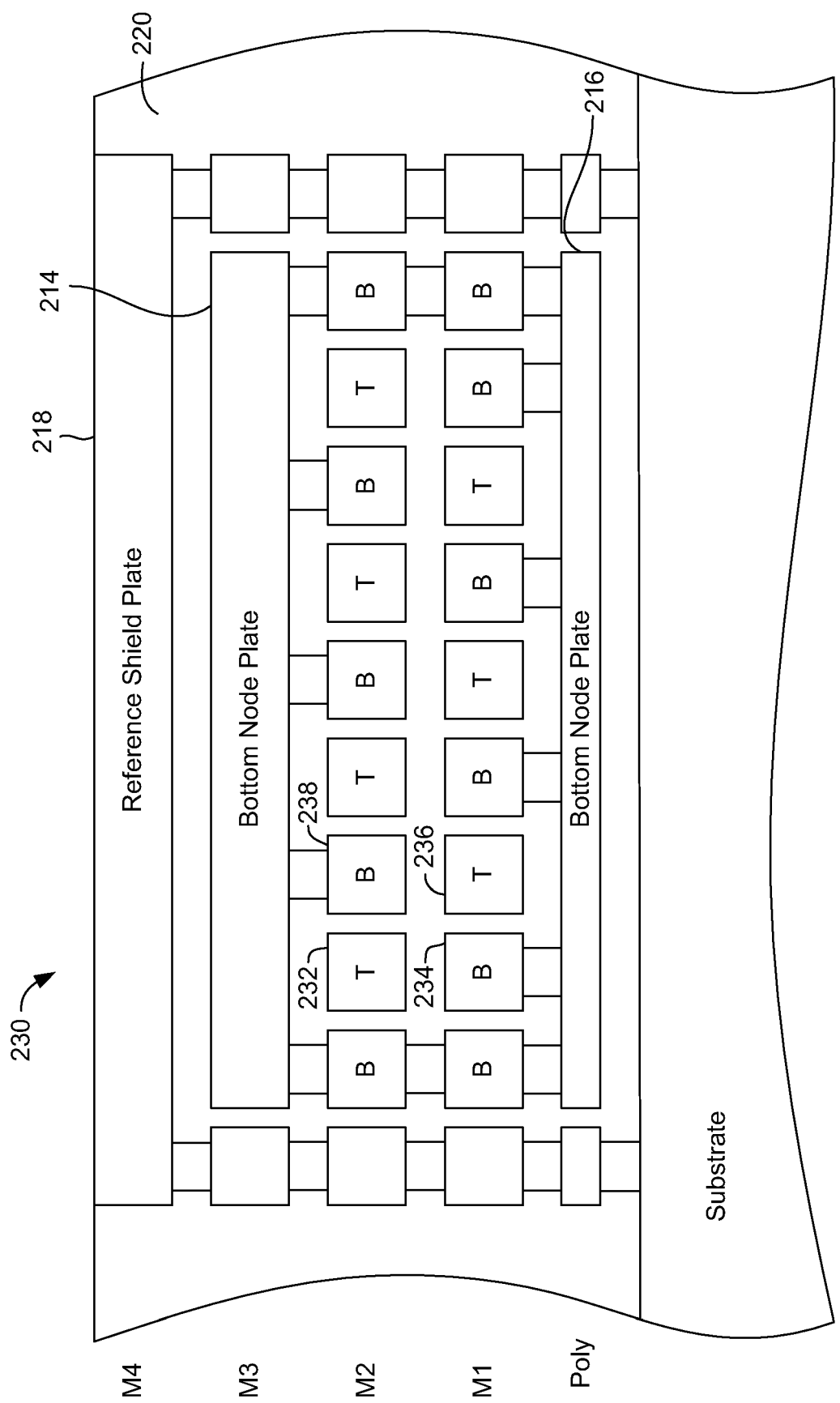
FIG. 2B is a side view of an integrated capacitor in accordance with FIG. 1A incorporated in the backend layers of an integrated circuit having alternating polarity between layers.

FIG. 2B is a side view of an integrated capacitor 230 in accordance with FIG. 1A incorporated in the backend layers of an integrated circuit having alternating polarity between layers. The integrated capacitor 230 shows a cross section of only a few fins for simplicity and clarity of illustration. A typical integrated capacitor according to an embodiment has hundreds of fins in each tier. A first metal layer M1 and a second metal layer M2 both have a quasi-fractal pattern of interlinked fins in accordance with FIG. 1A. The second metal layer M2 has the opposite polarity as the first metal layer M1, that is, a top node conductor 232 of the second metal layer overlies a bottom node conductor 234 of the first metal layer, and a bottom node conductor 236 of the second metal layer overlies a top node conductor 238 of the first metal layer. Alternating polarity in adjacent layers improves vertical capacitance. For instance, vertical capacitance between the metal layers increases the capacitance of the integrated capacitor by about 30% in an exemplary 40 nm node technology.

The integrated capacitor 230 includes an optional upper bottom node shield plate 214 and an optional lower bottom node shield plate 216, which in a particular embodiment is formed in the polysilicon ("poly") layer of the IC. The upper bottom node shield plate is typically formed of wide strips of patterned metal, rather than a contiguous sheet of metal, because most IC fabrication processes have maximum line width specifications for features formed in a metal layer. The lower bottom node shield plate formed in a poly layer can be a contiguous sheet if design rules allow such a structure. A lower bottom node shield plate formed in a metal layer would likely also be formed of wide strips of patterned metal. The upper and lower bottom shield plates shield the top node from unwanted coupling to other nodes in the IC, and provide additional vertical coupling to top node conductors in the intermediate metal layers, thus increasing specific capacitance of the integrated capacitor.

Shielding of the top node conductive elements by the bottom node conductive elements is desirable for insuring low-distortion sampled data transfers in an IC, for example. In a further embodiment, an optional reference shield plate 218 connected to analog ground, digital ground, or Vdd, for example, can be provided to shield the bottom node from unwanted coupling to other nodes in the IC. Dielectric material 220, such as silicon-oxide(s) formed from thermal and deposition processes, electrically isolates opposite node elements in the IC.

In a further embodiment, a third metal layer has the quasi-fractal pattern, and the optional shield plate is formed in a fifth metal layer, which in a particular embodiment is a ground plane layer of the IC. In another embodiment, an additional layer of interlinked fins is included (e.g., the bottom node shield plate 214 is formed in the M4 layer and the reference shield plate 218 is formed in the M5 layer). Forming a ground shield plate in the M5 layer is particularly desirable in ICs where the M5 layer is used to provide a ground plane layer, and more particularly where the portion of the M5 layer overlying the integrated capacitor provides an analog ground plane, which often has less electrical noise than a digital ground node in the IC. In another embodiment additional layers of interlinked fins are formed in the M3 and M4 layers, and the bottom node plate is formed in the M5 layer. In yet another embodiment, shield plates are omitted, or only one shield plate (e.g., poly plate 216) is provided.

Note that the types of and number of layers described are merely examples, and in some embodiments other suitable layers may be used, and any number of layers may be used. For example, the layers used may depend on the types and numbers of layers that are available in the manufacturing process, and other arrangements will be apparent to those of skill in the art. In general, any suitable layer, and an arbitrary number of layers may be used in accordance with embodiments of the present invention.

Figure 3:
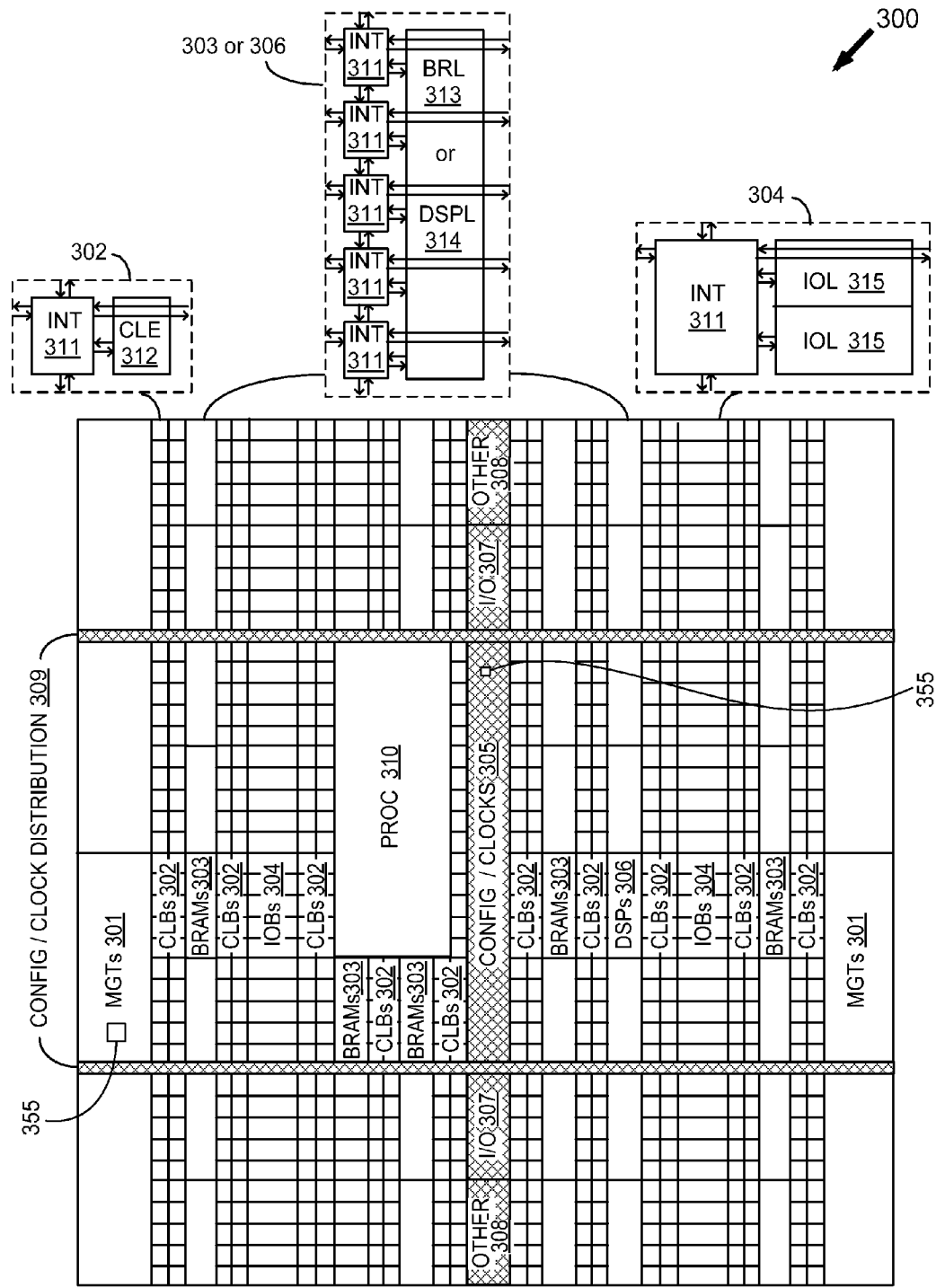
FIG. 3 is a plan view of an FPGA incorporating an integrated capacitor according to an embodiment.

FIG. 3 is a plan view of an FPGA 300 semiconductor device incorporating an integrated capacitor according to an embodiment. The FPGA 300 includes CMOS portions in several of the functional blocks, such as in RAM and logic, and is fabricated using a CMOS fabrication process. One or more integrated capacitors 355 according to one or more embodiments of the invention are incorporated in any of several functional blocks of the FPGA, such as a clock circuit 305, a multi-gigabit transceivers 301, or other functional block; within many functional blocks; or within a physical section or segment of the FPGA 300. Integrated capacitors 355 are particularly desirable in applications where one or both terminals of the capacitor are switched, and embodiments including top node shielding are further desirable in applications wherein the top node is connected to or switched to a high-impedance or high-gain node of a circuit in the FPGA 300. Integrated capacitors according to embodiments are also desirable in applications such as in an equalization filter in an MGT, where they are used as floating capacitors that couple one signal node to another. In a particular embodiment, an integrated capacitor according to an embodiment is incorporated into an analog section of the FPGA, such as a transceiver section or signal-processing section. In a further embodiment, the integrated capacitor includes a reference shield plate (see, FIGS. 2A, 2B, ref. num. 218) formed in an analog ground metal layer (e.g., an M5 layer in an exemplary FPGA), and the reference shield is connected to the analog ground terminal of the FPGA, which is typically quieter than the digital ground terminal.

The FPGA architecture includes a large number of different programmable tiles including multi-gigabit transceivers (MGTs 301), configurable logic blocks (CLBs 302), random access memory blocks (BRAMs 303), input/output blocks (IOBs 304), configuration and clocking logic (CONFIG/CLOCKS 305), digital signal processing blocks (DSPs 306), specialized input/output blocks (I/O 307) (e.g., configuration ports and clock ports), and other programmable logic 308 such as digital clock managers, analog-to-digital converters, system monitoring logic, and so forth. Some FPGAs also include dedicated processor blocks (PROC 310).

In some FPGAs, each programmable tile includes a programmable interconnect element (INT 311) having standardized connections to and from a corresponding interconnect element in each adjacent tile. Therefore, the programmable interconnect elements taken together implement the programmable interconnect structure for the illustrated FPGA. The programmable interconnect element (INT 311) also includes the connections to and from the programmable logic element within the same tile, as shown by the examples included at the top of FIG. 3.

For example, a CLB 302 can include a configurable logic element (CLE 312) that can be programmed to implement user logic plus a single programmable interconnect element (INT 311). A BRAM 303 can include a BRAM logic element (BRL 313) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 306 can include a DSP logic element (DSPL 314) in addition to an appropriate number of programmable interconnect elements. An IOB 304 can include, for example, two instances of an input/output logic element (IOL 315) in addition to one instance of the programmable interconnect element (INT 311). As will be clear to those of skill in the art, the actual I/O pads connected, for example, to the I/O logic element 315 are manufactured using metal layered above the various illustrated logic blocks, and typically are not confined to the area of the input/output logic element 315. In the pictured embodiment, a columnar area near the center of the die (shown shaded in FIG. 3) is used for configuration, clock, and other control logic. Horizontal areas 309 extending from this column are used to distribute the clocks and configuration signals across the breadth of the FPGA.

Some FPGAs utilizing the architecture illustrated in FIG. 3 include additional logic blocks that disrupt the regular columnar structure making up a large part of the FPGA. The additional logic blocks can be programmable blocks and/or dedicated logic. For example, the processor block PROC 310 shown in FIG. 3 spans several columns of CLBs and BRAMs.

Note that FIG. 3 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 3 are purely exemplary. For example, in an actual FPGA more than one adjacent column of CLBs is typically included wherever the CLBs appear, to facilitate the efficient implementation of user logic.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A capacitor in an integrated circuit ("IC") comprising:
a first node conductor formed in a first metal layer of the IC having a first spine extending along a first direction, a first vertical element extending from the first spine along a second direction perpendicular to the first direction, a first capital element having a first end and a second end extending perpendicularly across an end of the first vertical element along the first direction, a first serif element extending from the first end of the first capital element toward the first spine, and a second serif element extending from the second end of the first capital element toward the first spine, the first vertical element, first capital element, first serif element and second serif element forming a first conductive fin, and a second conductive fin constructed as the first conductive fin extending perpendicularly from the first spine opposite the first conductive fin; and
a second node conductor formed in the first metal layer of the IC having a second spine extending along the first direction, a third conductive fin constructed as the first conductive fin having a third vertical element extending from the second spine along the second direction toward the first spine, and a third serif element extending from a third capital element of the third conductive fin toward the second spine, the third serif element being disposed between the first vertical element and the first serif element.

2. The capacitor of claim 1 further comprising a fourth conductive fin constructed as the first conductive fin extending from the second spine, a fourth serif element of the fourth conductive fin being disposed between the first vertical element and the second serif element.

3. The capacitor of claim 1 further comprising a first plurality of conductive fins, each of the first plurality of conductive fins constructed as the first conductive fin, extending from the first spine toward the second spine and a second plurality of conductive fins, each of the second plurality of conductive fins constructed as the first conductive fin, extending from the second spine interlinked with the first plurality of conductive fins.

4. The capacitor of claim 3 further comprising a third plurality of conductive fins, each of the third plurality of conductive fins constructed as the first conductive fin, extending from the first spine away from the second spine.

5. The capacitor of claim 4 wherein each of the third plurality of conductive fins is opposite a corresponding each of the first plurality of conductive fins along the first spine.

6. The capacitor of claim 3 wherein the second node conductor is a top node conductor and the second spine is an outermost spine of the top node conductor, the first node conductor further comprising a first node shield bar extending along the outermost spine of the top node conductor.

7. The capacitor of claim 3 wherein the second node conductor is a top node conductor further comprising a buss bar extending along the second direction, the second spine extending from the buss bar, and the first node conductor further comprising a first node shield bar extending along the buss bar.

8. The capacitor of claim 3 wherein the second node conductor is a top node conductor further comprising a buss bar and the second spine is an outermost spine of the top node conductor extending from the buss bar, the first node conductor further comprising a first node shield bar extending along the buss bar and a second node shield bar extending along the outermost spine.

9. The capacitor of claim 3 further comprising a second metal layer of the IC having a third plurality of conductive fins, each of the third plurality of conductive fins constructed as the first conductive fin, overlying the first plurality of conductive fins, and a fourth plurality of conductive fins, each of the fourth plurality of conductive fins constructed as the first conductive fin, overlying the second plurality of conductive fins.

10. The capacitor of claim 9 wherein the third plurality of conductive fins is electrically connected to the first plurality of conductive fins with a first plurality of conductive vias, and the fourth plurality of conductive fins is electrically connected to the second plurality of conductive fins with a second plurality of conductive vias.

11. A capacitor in an integrated circuit ("IC") comprising:
a first node conductor formed in a metal layer of the IC having a first node buss bar, a plurality of first node spines extending from the first node buss bar, a first plurality of T-shaped fins extending from a first node spine in a first direction and a second plurality of T-shaped fins extending from the first node spine in a second direction opposite the first direction; and
a second node conductor formed in the metal layer having a second node buss bar, a plurality of second node spines extending from the second node buss bar, a third plurality of T-shaped fins extending from a second node spine in the first direction and interlinking with at least some of the second plurality of T-shaped fins.

12. The capacitor of claim 11 wherein the first node is a bottom node of a switching capacitor and the first node conductor further includes bottom node shield bar proximate to and extending along the second node buss bar.

13. The capacitor of claim 12 wherein the first node conductor further includes a second bottom node shield bar proximate to and extending along the second node spine.

14. The capacitor of claim 11 wherein the second plurality of T-shaped fins is a mirror image of the first plurality of T-shaped fins.

15. The capacitor of claim 11 further comprising
a second plurality of first node spines in a second metal layer of the IC and a fourth plurality of T-shaped fins connected to the first node in the second metal layer overlying the first plurality of T-shaped fins in the first metal layer;
a second plurality of second node spines in the second metal layer of the IC and a fifth plurality of T-shaped fins connected to the second node in the second metal layer overlying the third plurality of T-shaped fins;
a first plurality of conductive vias connecting at least some of the T-shaped fins in the first plurality to at least some of the T-shaped fins in the fourth plurality; and
a second plurality of conductive vias connecting at least some of the T-shaped fins in the third plurality to at least some of the T-shaped fins in the fifth plurality.

16. The capacitor of claim 11 further comprising
a second plurality of first node spines in a second metal layer of the IC and a fourth plurality of T-shaped fins connected to the first node in the second metal layer overlying the third plurality of T-shaped fins connected to the second node in the first metal layer; and
a second plurality of second node spines in the second metal layer of the IC and a fifth plurality of T-shaped fins connected to the second node in the second metal layer overlying the first plurality of T-shaped fins connected to the first node in the first metal layer.

17. The capacitor of claim 11 wherein the IC is a field-programmable gate array having an analog section and further comprising a reference shield plate formed in an analog ground layer of the analog section.

18. The capacitor of claim 1 wherein the first vertical element has a width and a depth, the depth being greater than the width.

19. The capacitor of claim 1 further comprising a reference shield plate, the first metal layer being disposed between the reference shield plate and a substrate of the IC, the reference shield plate being electrically connected to an analog ground terminal of the IC.

* * * * *